(12) United States Patent
Yang

(10) Patent No.: US 8,836,116 B2
(45) Date of Patent: Sep. 16, 2014

(54) WAFER LEVEL PACKAGING OF MICRO-ELECTRO-MECHANICAL SYSTEMS (MEMS) AND COMPLEMENTARY METAL-OXIDE-SEMICONDUCTOR (CMOS) SUBSTRATES

(75) Inventor: Hsueh-An Yang, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 376 days.

(21) Appl. No.: 12/944,118

(22) Filed: Nov. 11, 2010

(65) Prior Publication Data

US 2012/0098122 A1   Apr. 26, 2012

Related U.S. Application Data

(60) Provisional application No. 61/405,475, filed on Oct. 21, 2010.

(51) Int. Cl.
| | | |
|---|---|---|
| *H01L 29/72* | (2006.01) | |
| *B81C 1/00* | (2006.01) | |
| *H01L 23/48* | (2006.01) | |
| *H01L 23/31* | (2006.01) | |
| *H01L 21/768* | (2006.01) | |

(52) U.S. Cl.
CPC ... *H01L 23/3171* (2013.01); *H01L 2224/05569* (2013.01); *B81C 1/00238* (2013.01); *H01L 23/481* (2013.01); *H01L 2224/13* (2013.01); *H01L 2224/13022* (2013.01); *H01L 21/76898* (2013.01); *H01L 2224/05* (2013.01); *H01L 2924/0002* (2013.01); *B81C 1/00571* (2013.01); *B81C 1/0023* (2013.01); *B81C 2203/0771* (2013.01)
USPC .................. 257/737; 257/751; 257/E21.087; 257/E23.068; 257/E23.161

(58) Field of Classification Search
USPC .................. 257/737, 751, E21.087, E23.068, 257/E23.161
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |

(Continued)

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

(Continued)

*Primary Examiner* — Edward Wojciechowicz
(74) *Attorney, Agent, or Firm* — Lowe Hauptman & Ham, LLP

(57) ABSTRACT

The embodiments of methods and structures for forming through silicon vias a CMOS substrate bonded to a MEMS substrate and a capping substrate provide mechanisms for integrating CMOS and MEMS devices that use less realestate and are more reliable. The through silicon vias electrically connect to metal-1 level of the CMOS devices. Copper metal may be plated on a barrier/Cu-seed layer to partially fill the through silicon vias, which saves time and cost. The formation method may involve using dual dielectric layers on the substrate surface as etching mask to eliminate a photolithographical process during the removal of oxide layer at the bottoms of through silicon vias. In some embodiments, the through silicon vias land on polysilicon gate structures to prevent notch formation during etching of the vias.

20 Claims, 11 Drawing Sheets

(56) References Cited

U.S. PATENT DOCUMENTS

| | | |
|---|---|---|
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,531,328 B1 | 3/2003 | Chen |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,582,496 B2 | 9/2009 | Lee et al. |
| 2007/0166982 A1* | 7/2007 | Preusse et al. ............... 438/597 |
| 2011/0186990 A1* | 8/2011 | Mawatari et al. ............ 257/737 |
| 2011/0291267 A1* | 12/2011 | Wang et al. .................. 257/737 |
| 2012/0126419 A1* | 5/2012 | Kripesh et al. ............... 257/774 |

OTHER PUBLICATIONS

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

* cited by examiner

WAFER LEVEL PACKAGING OF MICRO-ELECTRO-MECHANICAL SYSTEMS (MEMS) AND COMPLEMENTARY METAL-OXIDE-SEMICONDUCTOR (CMOS) SUBSTRATES

CLAIM OF PRIORITY

The present application claims the priority of U.S. Provisional application No. 61/405,475, entitled "Wafer-Level Packaging of Micro-Electro-Mechanical Systems (MRMS) and Complementary Metal-Oxide-Semiconductor (CMOS) Substrates," filed on Oct. 21, 2010, which is incorporated herein by reference in its entirety.

CROSS REFERENCES TO RELATED APPLICATIONS

The present application is related to U.S. application Ser. No. 12/846,504, entitled "Hermetic Wafer Level Packaging," filed on Jul. 29, 2010, U.S. application Ser. No. 12/846,353, entitled "Mechanisms For Forming Copper Pillar Bumps," filed on Jul. 29, 2010, and U.S. application Ser. No. 12/897,124, entitled "Novel Semiconductor Package With Through Silicon Vias.," filed on Oct. 4, 2010. The applications listed above are incorporated herein by reference in their entireties.

FIELD

This application relates to packaging of semiconductor chips and, more particularly, to wafer level packaging.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. For these advances to be realized, developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor device sizes continue to shrink, new packaging technologies have been developed to accommodate (and to take advantage of) the small semiconductor device sizes. One type of packaging technology is wafer level packaging, where the IC devices are packaged at the wafer level before the wafer is sliced. Existing wafer level packaging techniques may be expensive and may not be fully compatible with current Complementary Metal-Oxide-Semiconductor (CMOS) fabrication processes.

Therefore, while existing wafer level packaging methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE EXEMPLARY EMBODIMENTS

Figure 1A:
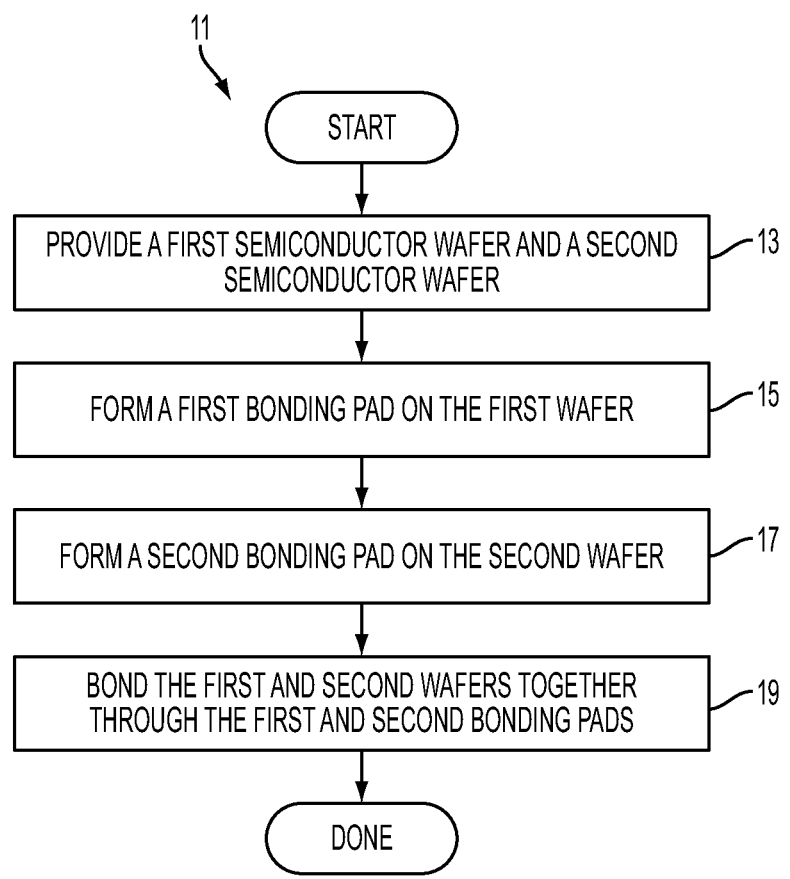
FIG. 1A shows a flowchart of a method of performing a wafer level packaging, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1A is a flowchart of a method 11 of performing a wafer level packaging according to various aspects of the present disclosure. The method 11 begins with block 13 in which a first semiconductor wafer and a second semiconductor wafer are provided. The method 11 continues with block 15 in which a first bonding pad is formed on the first wafer. The first wafer includes a first bonding pad. The method 11 continues with block 17 in which a second bonding pad is formed on the second wafer. The second bonding pad includes a second material that is different from the first material. The method 11 continues with block 19 in which the first and second wafers are bonded together through the first and second bonding pads.

Figure 1B:
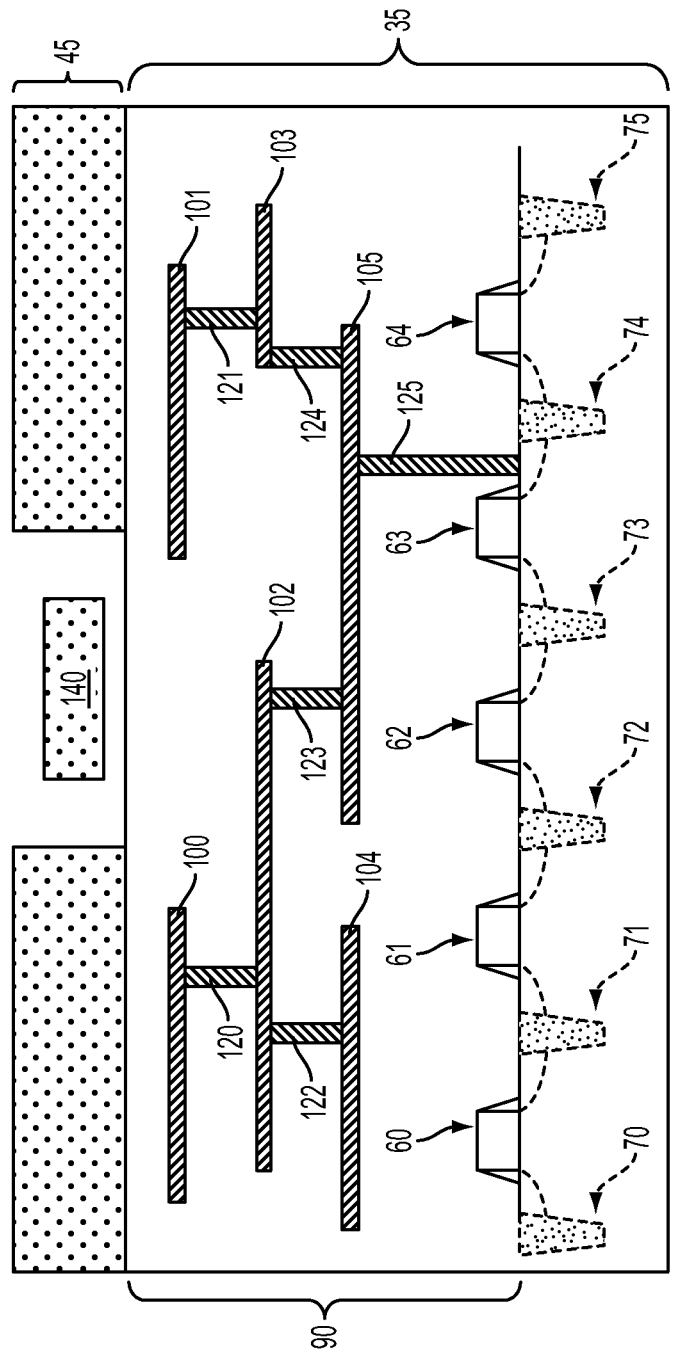
FIGS. 1B to 1D show cross-sectional views of portions of wafers undergoing wafer level packaging at different stages, in accordance with some embodiments.
Figure 1C:
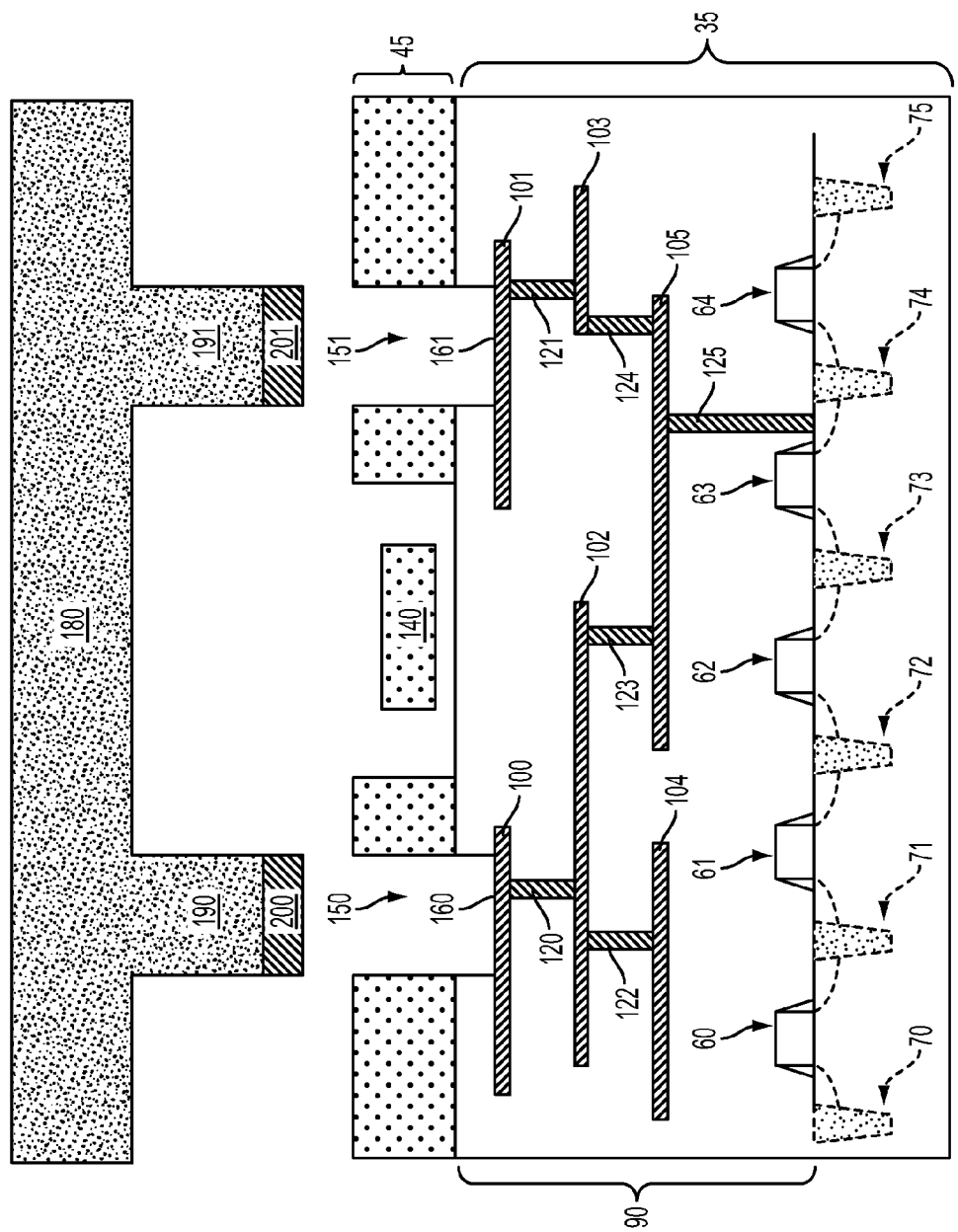
Figure 1D:
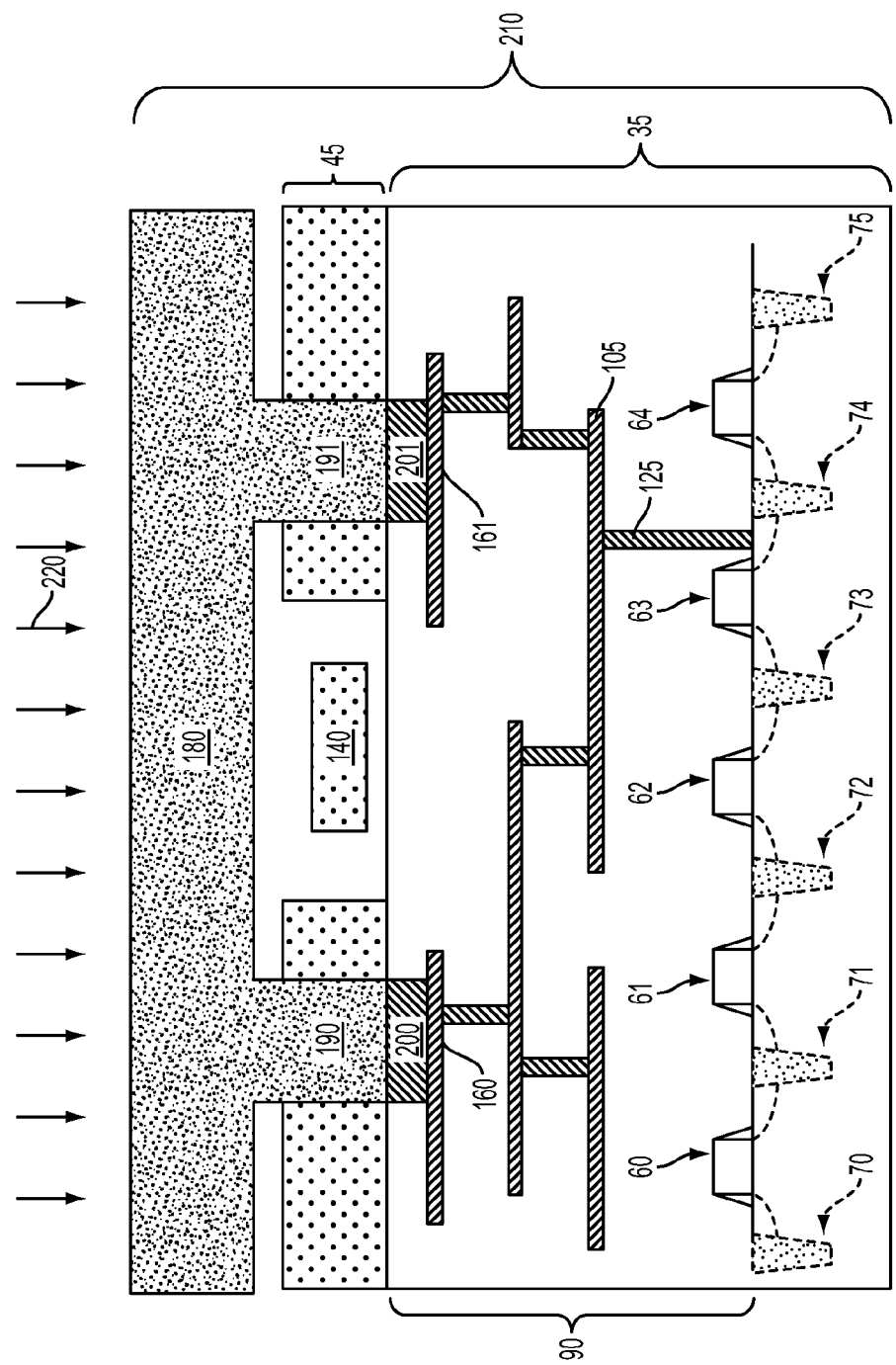

FIGS. 1B to 1D are diagrammatic fragmentary cross-sectional side views of portions of wafers undergoing wafer level packaging at different stages, in accordance with some embodiments. It is understood that FIGS. 1B to 1D have been simplified for a better understanding of the inventive concepts of the present disclosure.

FIG. 1B illustrates a portion of a wafer 35 and a portion of a wafer 45. The wafer 35 and 45 may also be referred to as substrates. The wafer 35 includes silicon doped with either a P-type dopant such as boron or N-type dopant such as phosphorous or arsenic. The wafer 35 may include other elementary semiconductors such as germanium and/or diamond. The wafer 35 may optionally include a compound semiconductor and/or an alloy semiconductor. Further, in some embodiments, the wafer 35 may include an epitaxial layer (epi layer), may be strained for performance enhancement, and may include a silicon-on-insulator (SOI) structure.

The wafer 35 includes a plurality of transistor devices, for example Complementary Metal-Oxide-Semiconductor (CMOS) Field-Effect Transistor (FET) devices. To provide an example, simplified cross-sectional views of transistor devices 60-64 are shown in FIG. 1B. These transistor devices 60-64 may each include a gate, a doped source region, and a doped drain region. In some embodiments, the gate may be a polysilicon gate or a metal gate, and may include a gate dielectric layer, a gate electrode layer, and gate spacers. In at least one embodiment, the transistor devices 60-64 may also be isolated from one another by isolation structures 70-75. In some embodiments, the isolation structures 70-74 may each include a shallow trench isolation (STI) feature, a deep trench isolation (DTI) feature, or a field oxide isolation feature. The isolation structures 70-75 may also each include a doped well formed around the STI feature or the DTI feature. Although not illustrated, it is understood that many other different types of transistor devices may be formed in the wafer 35. For purposes of simplicity, these devices are not illustrated herein.

The wafer 35 also includes an interconnect structure 90. The interconnect structure 90 includes an interlayer dielectric (ILD) and a multilayer interconnect (MLI) structure formed in a configuration such that the ILD separates and isolates each of the metal layers in the MLI structure. The MLI structure includes contacts/vias and metal lines formed in various metal layers (metal interconnect features) that provide interconnections (e.g., wiring) between the various metal layers, doped features, circuitry, and/or input/output of transistor devices (e.g., transistor devices 60-64) in the wafer 35. For the sake of providing an example, simplified cross-sectional views of metal lines 100-105 and vias/contacts 120-125 are illustrated in FIG. 1B. Metal lines 100-101 are formed above all the other metal lines and therefore may be referred to as top metal or a top metal layer. Metal lines 104-105 are formed below all other metal lines and are referred to as first metal (or M1) layer.

In some embodiments, the metal lines 100-105 may be aluminum-based or copper-based, and may include one or more barrier layers. The metal lines 100-105 may be formed by a technique including chemical vapor deposition (CVD), physical vapor deposition (PVD), sputtering, plating, combinations thereof, or other suitable processes.

The wafer 45 includes a semiconductor material such as silicon. The wafer 45 also includes one or more Micro-Electrical-Mechanical System (MEMS) devices 140. MEMS devices include very small electrical/mechanical devices, such as sensors, actuators, mirrors, gyroscopes, accelerometers, or other small machines. A MEMS device may also have one or more processors or controllers that communicate with and/or control the mechanical components.

MEMS devices may also be referred to as micro-machines, and the MEMS technology may also be referred to as Micro Systems Technology (MST). In some embodiments, the MEMS devices may have device sizes ranging from about 10 microns (μm) to 1000 microns. In some other embodiments, the MEMS devices may have device components that have sizes ranging from about 1 to 100 microns. A simplified diagrammatic view of a MEMS device 140 is illustrated in FIG. 1B for the sake of illustration and to facilitate ensuing discussions.

The wafers 35 and 45 are bonded together using a suitable bonding process. For example, in some embodiments, an optical bonding or a fusion bonding process may be utilized to bond the wafers 35 and 45 together.

Referring now to FIG. 1C, openings 150-151 are formed in the wafers 35 and 45 to expose a portion of the metal lines 100 and 101. The openings 150-151 actually are different parts of a single "ring" opening, but appear as two openings in this cross-sectional side view. The "ring" opening may have a circular shape, a rectangular shape, an oval shape, or another suitable shape. For the sake of illustration, the openings 150-151 are still referred separately therebelow, even though it is understood that they are actually parts of the same opening.

In at least one embodiment, the openings 150-151 may be formed by an etching process, such as a dry etching process. The openings 150-151 here will be used for a bonding process (discussed in FIG. 1D later), and thus the openings 150-151 may also be collectively referred to as a bond ring. The exposed portions of the metal lines 100 and 101 will be used as bonding pads for the bonding process, and thus they may be referred to as bonding pads (or bonding layers) 160-161 as well.

A wafer 180 is provided. The wafer 180 may include a semiconductor material such as silicon. The wafer 180 will be bonded to the wafer 35 in the bonding process discussed later, in a manner that the wafer 180 will "cap off" the MEMS device 140, and thus the wafer 180 may also be referred to as a capping layer. The wafer 180 includes protruding portions 190 and 191, which will be inserted into the openings 150 and 151 when the wafers 35 and 180 are bonded together later.

Bonding pads 200 and 201 are formed on the protruding portions 190 and 191, respectively. In some embodiments, the bonding pads 200-201 may be formed by PVD, CVD, evaporation, electron beam gun (E-Gun), ion beam, energy beam, plating, or combinations thereof. In at least one embodiment, the bonding pads 200-201 each include a titanium-based material or titanium alloy. For example, the titanium-based material or alloy of the bonding pads 200-201 may have the following chemical composition: $Ti_xAl_yCu_z$. In some embodiments, the bonding pads 200-201 may include TiAl, TiGe, AlGe, SiGe, or other suitable materials. It is also understood that similar to the openings 150-151 discussed above, the bonding pads 200-201 may actually be portions of the same bonding pad "ring".

Referring now to FIG. 1D, a bonding process 220 is performed to bond the wafer 180 to the wafer 35. The bonding process 220 may include:

a process temperature that is greater than approximately 100 degrees Celsius;

a process pressure that is greater than approximately 10 kilo-newtons per square meter; and a process duration that is in a range from approximately 3 minutes to approximately 300 minutes.

As a result of the bonding process 220, the wafer 180 is firmly bonded to the wafer 35 through the bonding pads 200 and 160, and through the bonding pads 201 and 161, which serve as bonding interfaces. The bonding pads 200 and 160 are bonded together through metal diffusion, as are the bonding pads 201 and 161. Bonding by way of metal diffusion is such that the metal ions from one bonding pad 200/201 respectively diffuse into the other bonding pad 160/161, and vice versa. Metal diffusion does not involve melting the materials of the bonding pads 160-161 and 200-201. Metal diffusion also results in high bonding strength, and therefore the bonding area can be relatively small.

In at least one embodiment, the wafers 35 and 180 are bonded in a manner to hermetically seal off the MEMS device 140 from external materials. Meanwhile, other MEMS devices on the same wafer 35 similar to the MEMS device 140 are hermetically sealed in the same fashion. In this manner, the wafer 45 is packaged on a wafer level. It is understood that in some other embodiments, the bonding pads 200-201 may include an aluminum-based material, and the bonding pads 160-161 may include a titanium-based material or a titanium alloy. After the wafers 35 and 180 are bonded, a post-bonding annealing process may be performed to increase bonding strength. Detailed information of the wafer level bonding process described above may be found in U.S. application Ser. No. 12/846,504, entitled "Hermetic Wafer Level Packaging," filed on Jul. 29, 2010, which is incorporated herein by reference in its entirety.

After wafers 35, 45 and 180 are bonded together to form a stack 210, external connection to the internal circuitry needs to be established. Conventional die bonding and wire bonding methods requires larger surface areas for the bonding purpose; therefore, they are not desirable for advanced packaging. In some embodiments, using through silicon vias to establish internal connection to devices and using bumps to provide contacts to the external electrical connection that occupy less areas and also provide better interconnect design flexibility than some die bonding or wire bonding approaches.

Figure 2A:
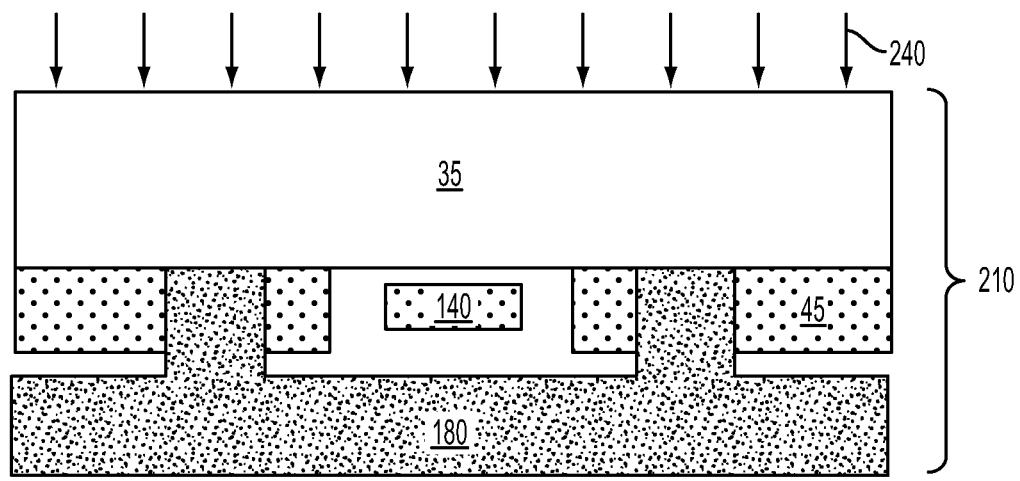
FIG. 2A-2K are diagrammatic fragmentary cross-sectional side views of portions of wafers undergoing wafer level packaging at different stages, in accordance with some embodiments.

FIG. 2A-2K are diagrammatic fragmentary cross-sectional side views of portions of wafers undergoing wafer level packaging at different stages, in accordance with some embodiments. FIG. 2A shows the stack 210 of substrates depicted in FIG. 1D being turned upside down, in accordance with some embodiments. A portion of the backside of substrate (wafer 35) is removed by a process 240, such as grinding, in accordance with some embodiments. Detailed structures in each of the wafers, 35, 45 and 180, are not shown.

Figure 2B:
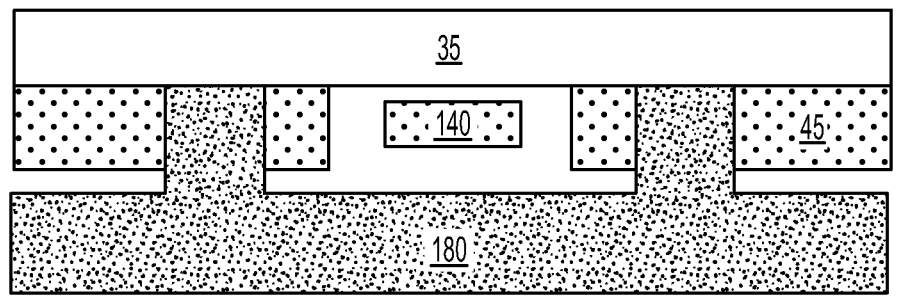
Figure 2C:
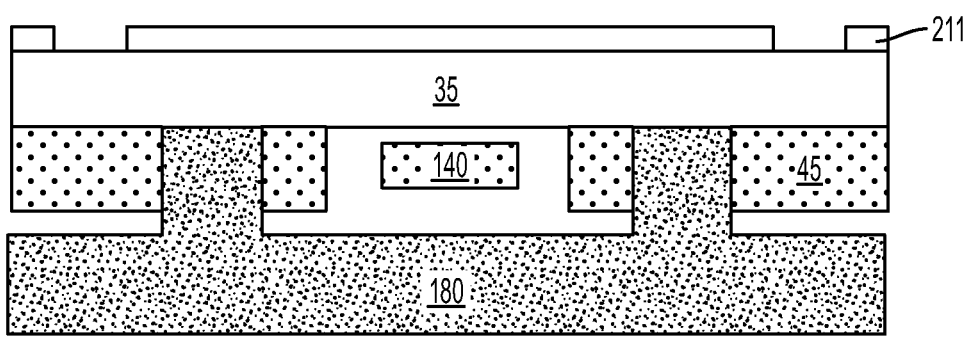

FIG. 2B depicts the substrate stack after substrate 35 being thinned, in accordance with some embodiments. The thickness of substrate 35 after the thinning process is in a range from about 100 μm to about 200 μm, in accordance with some embodiments. After substrate thinning, as depicted in FIG. 2C, a dielectric layer 211 is deposited and patterned over a thinned surface of the substrate stack. The dielectric layer 211 is a sacrificial layer used to protect substrate surface during the etching process of through silicon vias. In some embodiments, the photoresist layer (not shown) is removed before the etching process to create the through silicon vias. In some embodiments, the material for the dielectric layer 211 can be any dielectric material, such as silicon dioxide, silicon nitride, or a combination of both films. One example of a material for the dielectric layer 211 is silicon oxide deposited by plasma enhanced chemical vapor deposition (PECVD) using TEOS (Tetraethyl orthosilicate) as the silicon source. PECVD silane oxide film can also be used. In some embodiments, the TEOS oxide has a thickness in a range from about 500 Å to about 10000 Å. The dielectric layer 211 does not need to be deposited by PECVD. The dielectric layer 211 can be a spin-on dielectric (SOD) or a spin-on glass (SOG). It should also be noted that, in some embodiments, the dielectric layer 211 may comprise a plurality of dielectric layers.

Figure 2D:
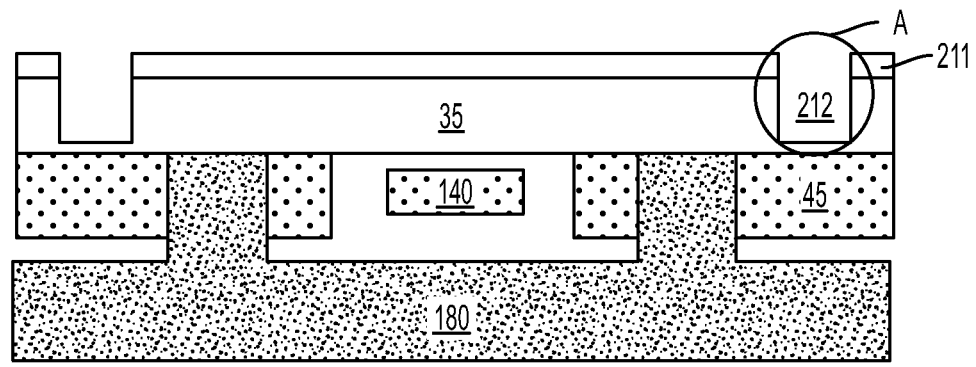
Figure 2E:
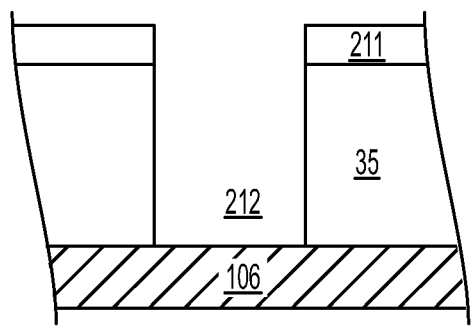

FIG. 2D shows the stack 210 after the openings in substrate 35 have been etched, in accordance with some embodiments. In at least one embodiment, a timed etching process, such as an anisotropic dry etch process, is performed until a desired depth for the openings (or through silicon vias) 212 is obtained in substrate 35. Openings 212 are created to form through silicon vias. The depth of the vias 212 is in a range from about 100 μm to about 200 μm, in accordance with some embodiments. It should be understood that the etch processes described herein may be accomplished in single etch processes or multiple etch processes. The etching process(es) can be a dry process or a wet process. FIG. 2E shows an enlarged and more detailed view of region A in FIG. 2D near one of the openings 212, in accordance with some embodiments. FIG. 2E shows that opening 202 lands on M1 ($1^{st}$ level metal), such as M1 106, of substrate 35. After the through silicon vias (TSVs) are formed by filling openings 212, external electrical connection can make contact with devices in substrates 35 and/or 45 via M1, such as M1 106, of substrate 35.

Figure 2F:
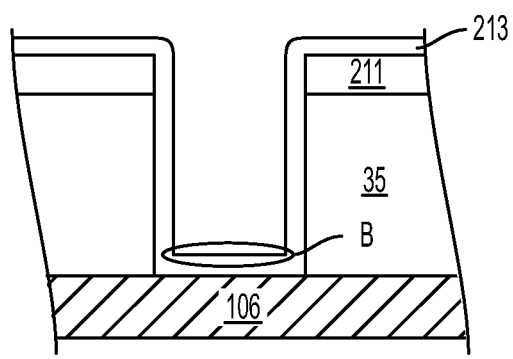

After the openings 212 are created, the openings are filled. FIG. 2F is an enlarged view corresponding to region A of FIG. 2D and shows that the substrate is first lined with an isolation layer 213, in accordance with some embodiments. In at least one embodiment, the isolation layer 213 is made of a dielectric material, such as oxide, nitride, or a combination of both. One example of a material for the isolation layer 213 is silicon oxide deposited by plasma enhanced chemical vapor deposition (PECVD) using silane or TEOS as the silicon source. In some embodiments, the isolation layer has a thickness in a range from about 500 Å to about 15000 Å. In some alternative embodiments, the dielectric isolation layer 213 can be a doped film, using dopants such as phosphorus (P) or boron (B) and phosphorus (P). The phosphorus (P) in the phosphorus silicon glass (PSG) or boron phosphorus silicon glass (BPSG) film can getter copper, which is used to fill the openings for forming through silicon vias (or trenches) in this example. Copper can diffuse in the silicon substrate. Although the through silicon vias are lined with a barrier layer, which will be described later, the barrier coverage could be insufficient on the sidewalls near the bottom of the vias, such as bottom corners of the vias. Using PSG or BPSG as the isolation layer 213 can provide extra protection against copper diffusion.

Figure 2G:
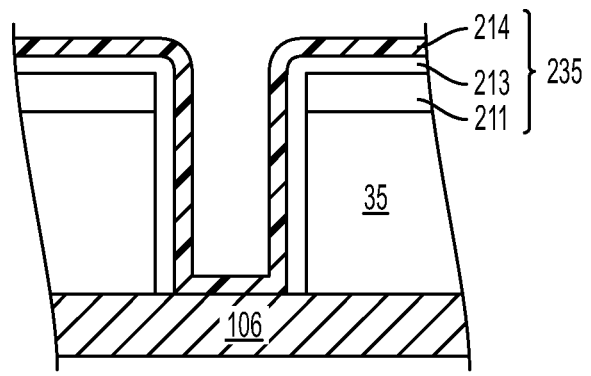

To allow electrical connection to be made through silicon vias formed by filling openings 212, the bottom portion B (or bottom) of the isolation layer 213 needs to be removed. In some embodiments, an anisotropic dielectric etching process can be used to remove the isolation layer 213 at the bottom openings 212 (or region B). FIG. 2G shows the cross-sectional view of the opening 212 depicted in FIG. 2F, after the isolation layer 213 at the bottoms of openings 212 is removed and a barrier/Cu-seed layer 214 is deposited. The film stack 235 includes dielectric layers 211 and 213 and the barrier/Cu-seed layer 214 on the surface (thinned backside surface) of substrate 35. At bottom of the through silicon via, there is no dielectric layer(s). On the top surface (thinned backside surface) of substrate 35, there are two layers, 211 and 213, of dielectric films. The double layers, 211 and 213, of dielectric films protect the substrate surface from being exposed to etching plasma during etching of layer 213 at the bottoms of openings 212. The process described above by using the dual layers, 211 and 213, of dielectric films to protect the substrate surface during the removal of bottom dielectric film is very simple and does not require a lithographical process (self-aligned). In some embodiments, an alternative method of forming the isolation layer 213 to cover only the sidewalls of openings 212 and the top surface of substrate 35 involves using patterned photoresist layers to create the openings and to remove the dielectric film at the bottoms of openings 212. However, such process requires using photolithography a couple of times. Photolithographical process is a very expensive process.

Afterwards, the barrier/Cu-seed layer 214 is deposited, in accordance with some embodiments. The barrier/Cu-seed layer 214 includes at least two sub-layers, a barrier layer and a copper seed layer. The barrier layer comprises one or more copper barrier materials, such as Ta, TaN, Ti, TiN, CoW, or the like. The barrier layer provides protection against copper diffusing into the silicon substrate 35. In some embodiments, the barrier layer can be deposited by PVD (physical vapor deposition), chemical vapor deposition (CVD), atomic layer deposition (ALD), or other suitable methods. After the deposition of the barrier layer, a copper seed layer is deposited. Similarly, in some embodiments, the copper seed layer can be deposited by PVD (physical vapor deposition), chemical vapor deposition (CVD), atomic layer deposition (ALD), or other suitable methods. In some embodiments, the barrier/Cu-seed layer 214 is made of TaN/Ta bather and a copper seed layer. The bather layer 214 in this embodiment is made of two sub layers, a TaN layer and a Ta layer. In some embodiments, TaN, Ta and Cu seed are all deposited by PVD, and the deposition of TaN, Ta, and Cu seed are all performed in one single PVD chamber with different targets and sputtering gases. In some embodiments, each thickness of TaN and Ta is in a range from about 100 Å to about 2000 Å, and the thickness of the copper seed is in a range from about 1000 Å to about 15000 Å.

Figure 2H:
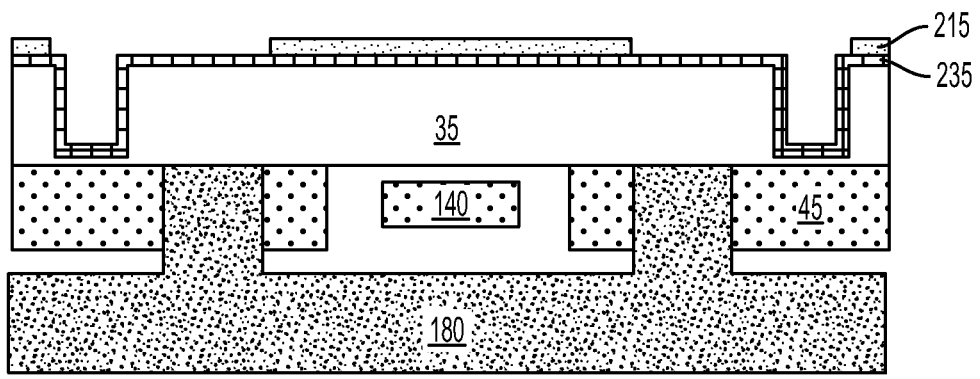

After the deposition of the barrier/copper-seed layer 214, the substrate is patterned to define areas to receive copper plating. FIG. 2H shows a patterned photoresist layer 215 being formed on substrate 35, in accordance with some embodiments. In some embodiments, the patterned photo-layer 215 is made of applicable photoresist known to a person having ordinary skill in the art, which is usually in liquid form and is deposited by a spin-on process. In some other embodiments, the material of the patterned photo-layer 215 is a dry film resist (DFR), which can also be patterned by photolithography (i.e. with light exposure). The DFR can be a positive or a negative photoresist. DFR is used for creating patterns for copper plating for circuit boards. An example of DFR is MP112, made by TOK CO. LTD. of Japan. After the DFR is laminated on substrate 35 (or over layer 214), the DFR is exposed with a pattern that defines areas on the substrate surface that would receive copper plating. In some embodiments, using dry film resist has an advantage over the wet spin-on photoresist that the dry film resist is only laminated on the substrate surface. In contrast, wet spin-on photoresist would flow into the opening 212. Since the openings for through silicon vias (or trenches) are quite deep, such as being in a range from about 100 µm to about 200 µm in some embodiments, the wet photoresist filled inside could be hard to be removed completely for copper to be properly plated on the sidewalls and bottom surfaces of the openings.

Figure 2I:
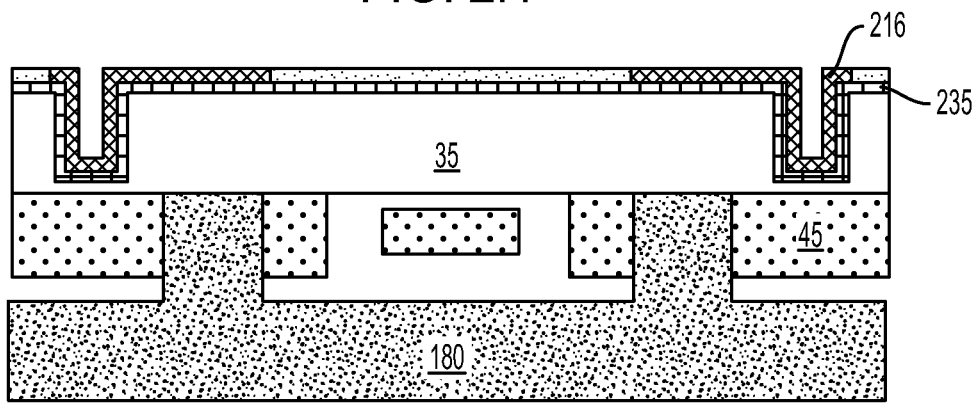

FIG. 2I shows a copper film 216 being plated on substrate 35, in accordance with some embodiments. In some embodiments, Electrical copper plating (ECP) processes or electroless copper plating process used in the metal interconnects of semiconductor device manufacturing can be used for forming the copper film 216. In some embodiments, the thickness of the copper film 216 is less than about 15 µm. In some other embodiments, the thickness of the copper film 216 is less than about 10 µm. In yet some other embodiments, the thickness of the copper film 216 is in a range from about 5 µm to about 10 µm.

The copper film 216 does not completely fill the openings 212 and its thickness only needs to provide sufficient surface coverage and conductivity. Copper plating is a time-consuming process. Without requiring copper plating to fill openings 212, time for forming the copper film can be shortened and manufacturing cost can be reduced. In addition to being plated on surfaces of openings 212, the copper film 216 is also deposited on the surface (backside surface) of substrate 35 to form a redistribution layer to provide electrical connection at locations away from the through silicon vias.

After the copper film 216 is deposited and the DRF 215 is removed. One or more passivation layers are deposited over the substrate to cover the copper film 216 and other portions of surface of substrate 35. The barrier/Cu-seed layer 214 that is exposed is then etched. Details of the removal of exposed barrier/Cu-seed layer 214 may be found in U.S. application Ser. No. 12/897,124, entitled "Novel Semiconductor Package With Through Silicon Vias," filed on Oct. 4, 2010, which is incorporated herein by reference in its entirety.

Figure 2J:
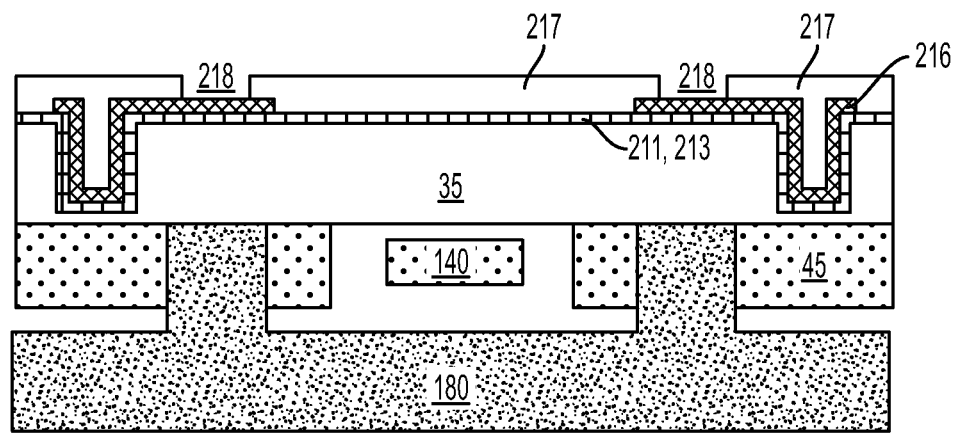

Afterwards, a polymer layer 217 is deposited over substrate 35. FIG. 2J shows a polymer layer 217 is deposited and patterned over substrate 35, in accordance with some embodiments. In some embodiments, under the polymer layer 217, there is a passivation layer (not shown), which may be made of SiN. Following the deposition of the polymer layer 217, another lithographical process and another etching process are performed to pattern the polymer layer 217. As a result, openings 218 are formed to pass through the polymer layer 217 and expose a portion of the copper film 216 for allowing subsequent bump/post process. The polymer layer 217, as the name suggests, is formed of a polymer, such as an epoxy, polyimide, benzocyclobutene (BCB), polybenzoxazole (PBO), or the like, although other relatively soft, often organic, dielectric materials can also be used. In some embodiments, the polymer layer 217 is a polyimide layer. In some other embodiments, the polymer layer 217 is a polybenzoxazole (PBO) layer. The polymer layer 217 is soft, and hence has the function of reducing inherent stresses on respective substrate. In addition, the polymer layer 217 is easily formed to thickness of tens of microns. The polymer layer 217 fills the space left un-filled in the openings 212.

Figure 2K:
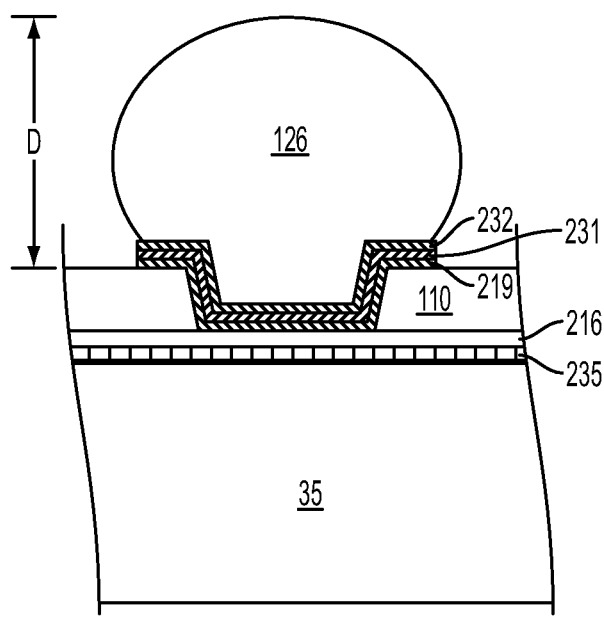

Referring to FIG. 2K, an under-bump-metallurgy (UBM) layer 219 is formed in one of the openings 218 of FIG. 2J, in accordance with some embodiments. In some embodiments, the UBM layer includes a diffusion barrier layer and a seed layer. The UBM layer 219 is formed on the polymer layer 217 and the exposed portion of the conductive layer 216, and lines the sidewalls and bottom of the openings 218. The diffusion barrier layer may also function as an adhesion layer (or a glue layer), in some embodiments. The diffusion barrier layer is formed to cover the sidewalls and the bottom of the openings 218. In some embodiments, the diffusion bather layer may be formed of tantalum nitride, although it may also be formed of other materials such as titanium nitride, tantalum, titanium, or the like. The thickness of the diffusion barrier layer is in a range from about 500 Å to about 5000 Å, in some embodiments. In some embodiments, the formation methods include physical vapor deposition (PVD) (or sputtering). The seed layer may be a copper seed layer formed on the diffusion barrier layer. The copper seed layer may be formed of copper or one of copper alloys that include silver, chromium, nickel, tin, gold, or combinations thereof. The thickness of the copper seed layer is in a range from about 2000 Å to about 8000 Å, in some embodiments. In some embodiments, the UBM layer 219 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods.

Next, a mask layer (not shown) is provided on the UBM layer 219 and patterned with openings (not shown) exposing portions of the UBM layer 219 for metal formation. In some embodiments, the openings are over the opening 218. In some embodiments, the size of the openings is in a range from about 5 µm to about 100 µm. The mask layer may be a dry film or a photoresist film. The openings are then partially or fully filled with a conductive material with solder wettability. In at least one embodiment, a metal layer 125 is formed in the openings to contact the underlying UBM layer 219. In some embodiments, a copper layer 231 and a nickel layer 232 are deposited between the UBM layer 219 and the metal layer 125. The metal layer 125 protrudes above the surface of the polymer layer 110 with a thickness "D". In some embodiments, the thickness "D" ranges from about 5 µm to about 100 µm. The metal layer 125 may be a copper layer or a solder layer. Other types of metal with high conductivity may also be used to fill the openings. After the metal layer 125 is plated or filled, the mask layer is removed. If the metal layer is made of solder, the solder layer is reflowed into ball shape and the structures in the openings are called solder bumps. If the metal layer is copper, additional cap layer and solder layer could be further deposited on top of the metal layer, and the metal layer and other structures formed in the openings may be called copper posts. Details of formation of metal bumps and posts can be found in U.S. application Ser. No. 12/846,353, entitled "Mechanisms For Forming Copper Pillar Bumps," filed on Jul. 29, 2010, which is incorporated herein by reference in its entirety.

Figure 3A:
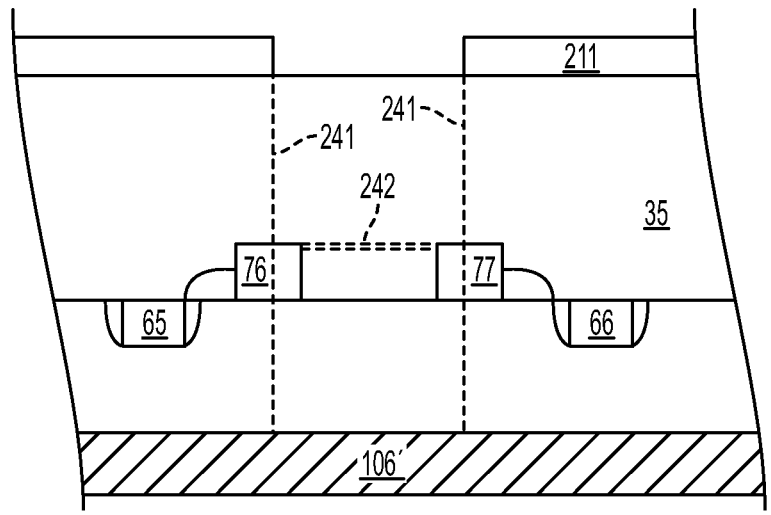
FIG. 3A shows a portion of substrate before the etching of through silicon vias, in accordance with some embodiments.
Figure 3B:
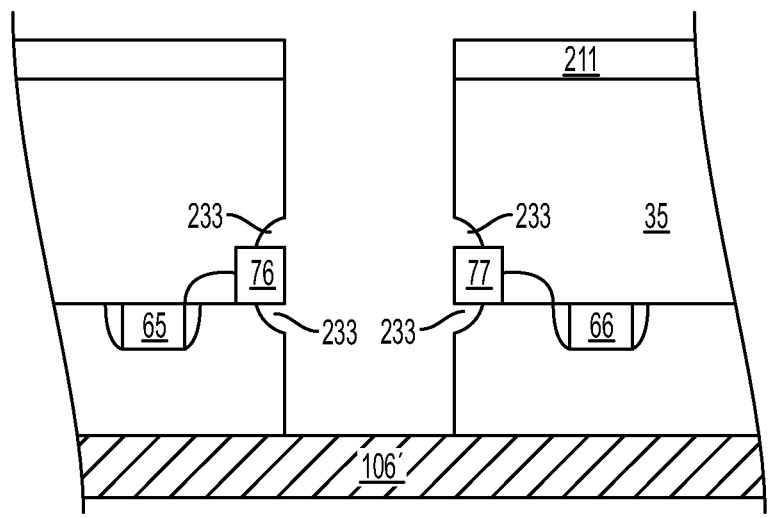
FIG. 3B shows the portion of substrate depicted in FIG. 3A after the through silicon via etch is completed, in accordance with some embodiments.

As mentioned above, transistors 65, 66 in a CMOS substrate (substrate 35) are separated by dielectric isolation structures, such as field oxide or shallow trench isolation (STI) 76, 77. During the etching of through silicon vias, removing the dielectric isolation layer could result in lateral over-etching of silicon. FIG. 3A shows a portion of substrate 35 before the etching of through silicon vias, in accordance with some embodiments. FIG. 3B shows the portion of substrate 35 in FIG. 3A after the through silicon via etch is completed, in accordance with some embodiments. The dotted lines 241 in FIG. 3A shows the intended etching boundaries of through silicon via etch and the boundaries overlap with the edge areas of STI 232. In some embodiments, the two STI 76, 77 in FIG. 3A are connected into one single STI structure (shown by the double dotted line 242). Since the etching properties of STI, which is filled with oxide, and silicon are different, during the creation of the through silicon via 218' (FIG. 3C), portions of the silicon substrate are etched laterally and notches 233 are formed, as shown in FIG. 3B. Notches 233 are difficult to fill during the subsequent deposition of the isolation layer 213, the barrier/Cu-seed layer 214 and the copper film 216, which could result in insufficient isolation and discontinuous conductive layers.

Figure 3C:
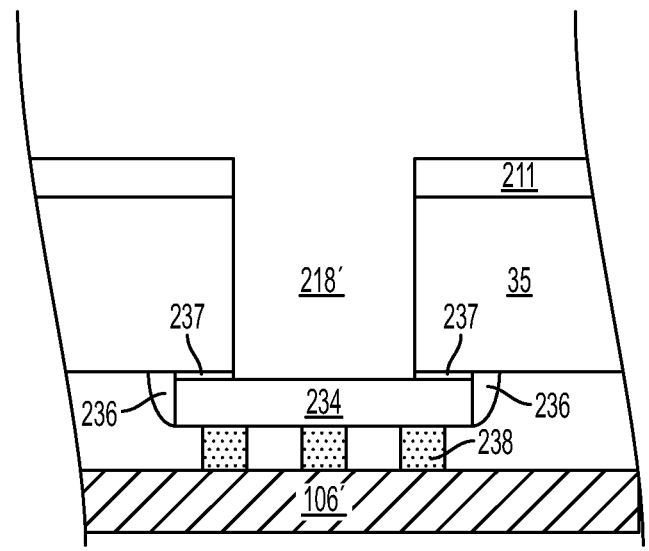
FIG. 3C shows a dummy polysilicon gate structure being formed under the opening of through silicon via, in accordance with some embodiments.

To prevent such issues, in some embodiments, a dummy polysilicon gate structure 234 can be formed under an opening 218' of through silicon via, as shown in FIG. 3C in accordance with some embodiments. Between the polysilicon gate structure 234 and the M1 structure 106', there are a number of contact plugs 238, which provide connection between the polysilicon gate structure 234 and M1 structure 106'. Under the polysilicon gate structure 234, there could be a gate dielectric layer 237. Spacers 236 could also accompany the polysilicon gate structure 234. During the etching of the opening 218', the etchant etches away at least a portion of the thin gate dielectric 237 and come in contact with the polysilicon gate structure 234, instead of the dielectric isolation structure. Since the gate dielectric 237 is fairly thin, it is much easier to etch away than the field oxide or STI and would not result in notch formation. Further, over-etching of the polysilicon gate structure 234 does not pose an issue, since it is a conductive material and would not result in discontinuity of forming the conductive layers 214 and 216 afterwards. Even if the polysilicon gate structure 234 is completely etched away, the contact plugs 238 underneath can still provide electrical connection to the M1 structure 216. More than one contact plugs 238 are formed between the polysilicon gate structure 234 and the metal-1 (first metal level) structure 106' to ensure redundant connection is provided.

Figure 3D:
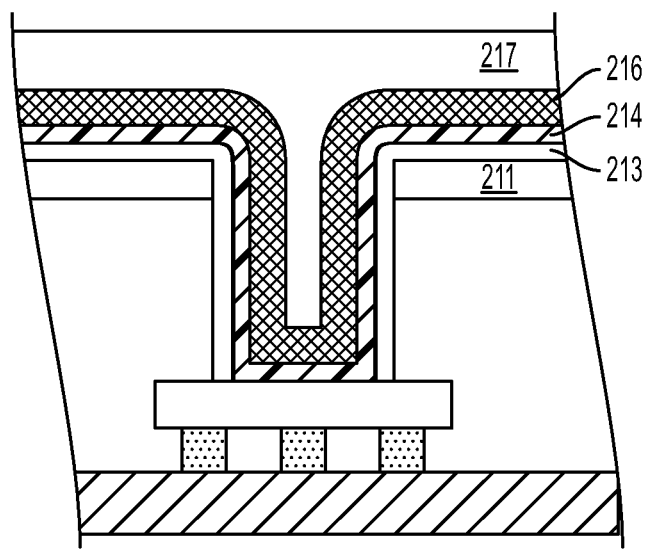
FIG. 3D shows the structure of FIG. 3C with the through silicon via being filled, in accordance with some embodiments.

After the opening 218' is etched, substrate 35 may undergo process sequence described above for FIGS. 2F-2K, in accordance with some embodiments. FIG. 3D shows the area in FIG. 3C after the opening 218' is filled with conductive layers 214 and 216, and also the polymer layer 217, in accordance with some embodiments.

The embodiments of packaged structures shown in FIGS. 1D and 2K occupy much less space (real-estate) than some wire-bonding schemes for integrating CMOS and MEMS chips. The electrical connection via wafer-level bonding and through silicon vias is also much for reliable than wire-bonding.

Figure 4:
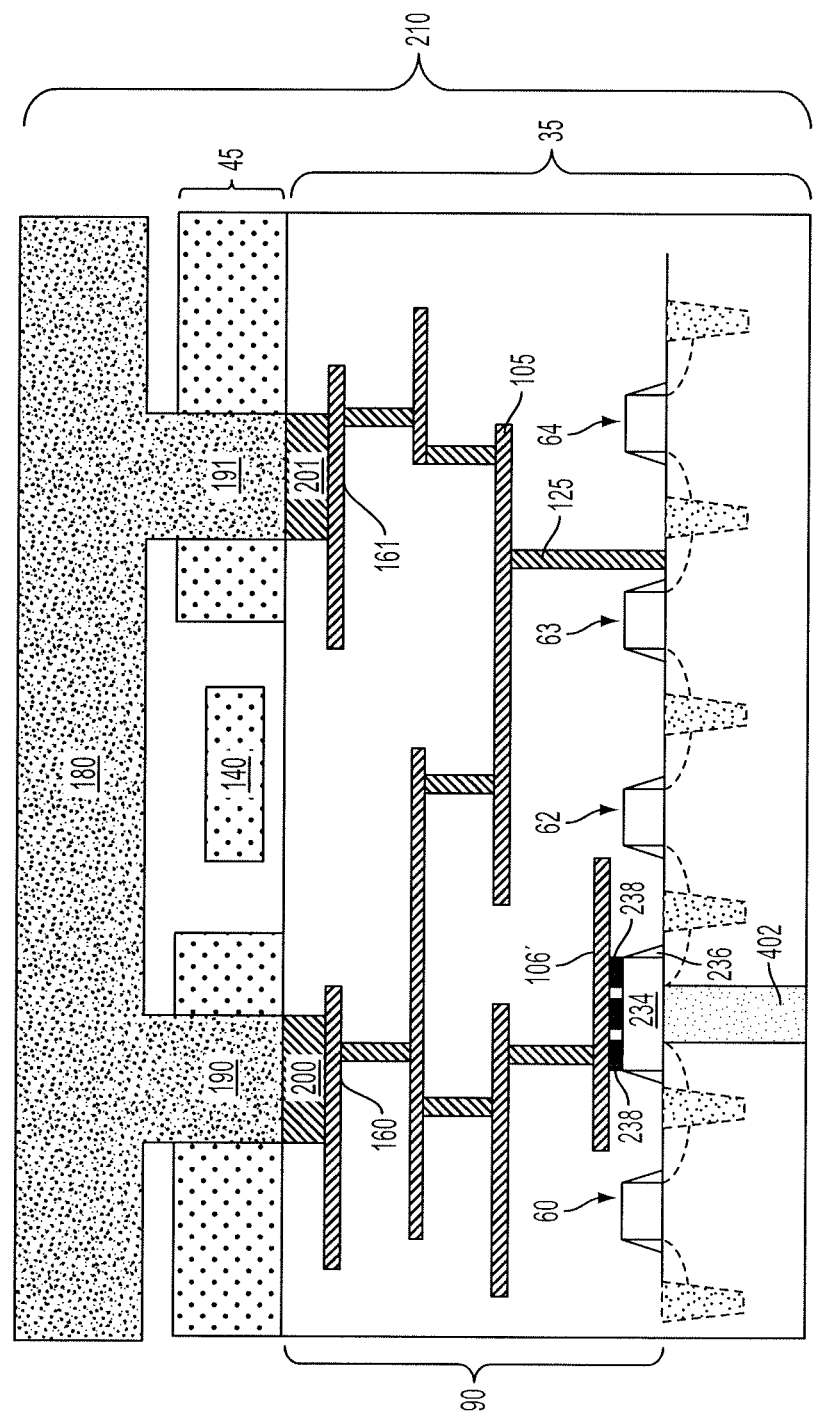
FIG. 4 is a cross-sectional view of portions of wafers with a through silicon via connected to a dummy polysilicon gate structure, in accordance with some embodiments.

FIG. 4 is a cross-sectional view of portions of wafers with a TSV 402 connected to dummy polysilicon gate structure 234. The portions of the wafers in FIG. 4 are similar those of FIG. 1D with the inclusion of TSV 402. TSV 402 is a laminate of isolation layer 213, barrier/Cu-seed layer 214, copper film 216 and polymer layer 217 (FIG. 3D). Contact plugs 238 provide connection between dummy polysilicon gate structure 234 and M1 structure 106'.

The embodiments of methods and structures for forming through silicon vias in a CMOS substrate bonded to a MEMS substrate and a capping substrate provide mechanisms for integrating CMOS and MEMS devices that occupies less real-estate and are more reliable. The through silicon vias electrically connect to metal-1 level of the CMOS devices. Copper metal may be plated on a barrier/Cu-seed layer to partially fill the through silicon vias, which saves time and cost. The formation method may involve using dual dielectric layers on the substrate surface as etching mask to eliminate a photolithographical process during the removal of oxide layer at the bottoms of through silicon vias. In some embodiments, the through silicon vias land on polysilicon gate structures to prevent notch formation during etching of the vias.

In at least one embodiment, a semiconductor device package is provided. The semiconductor device package includes a first substrate electrically bonded to a second substrate, and the first substrate having a through silicon via extending from a first surface of the first substrate to a first-level metal structure of the first substrate. The through silicon via is lined with an isolation layer and a conductive layer with a copper-barrier sub-layer and a copper-seed sub-layer, and the through silicon via is partially filled with a copper layer. The copper layer is deposited on the conductive layer to form a continuous layer. The through silicon via electrically contacts the first-level metal structure and a connection structure of the semiconductor device package that enables electrical contact between the semiconductor device package and an external connection structure.

In another embodiment, a semiconductor device package is provided. The semiconductor device package includes a first substrate electrically bonded to a second substrate. The first substrate having a through silicon via extending from a first surface of the first substrate to a polysilicon gate structure of the first substrate. The through silicon via is lined with an isolation layer and a conductive layer with a copper-barrier sub-layer and a copper-seed sub-layer, and a copper layer is deposited on the conductive layer. The through silicon via electrically contacts the polysilicon gate structure and a connection structure of the semiconductor device package that enables electrical contact between the semiconductor device package and an external connection structure.

In yet another embodiment, a method of forming a semiconductor device package is provided. The method includes bonding a front surface of a first substrate to a front surface of a second substrate, and thinning a back surface of the first substrate. The method also includes depositing and patterning a dielectric layer on the thinned back surface of the first substrate, and etching the first substrate after the depositing and the patterning of the dielectric layer are performed to form a through silicon via to enable making a electrical connection with a first level metal of the first substrate. The method further includes depositing an isolation layer to line the through silicon via is formed, and etching the isolation layer at the bottom of the through silicon via. In addition, the method includes depositing a conductive layer to line the through silicon via after the isolation layer at the bottom of the through silicon via is etched, and deposited a copper film over the conductive layer.

Various modifications, changes, and variations apparent to those of skill in the art may be made in the arrangement, operation, and details of the methods and systems disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the embodiments are not to be limited to the details given herein.

What is claimed is:

1. A semiconductor device package, comprising:
    a first substrate electrically bonded to a second substrate, wherein the first substrate having a through silicon via extending from a first surface of the first substrate to a first-level metal structure of the first substrate,
    wherein the through silicon via is lined with an isolation layer and a conductive layer with a copper-barrier sub-layer and a copper-seed sub-layer, and the through silicon via is partially filled with a copper layer,
    wherein the copper layer is deposited on the conductive layer to form a continuous layer and a redistribution layer, the redistribution layer being over and extending laterally along the first surface of the first substrate beyond the through silicon via, and
    wherein the through silicon via is electrically connnected to the first-level metal structure through a gate structure and a plurality of contact plugs, and
    the through silicon via is electrically connected to a connection structure of the semiconductor device package that enables electrical contact between the semiconductor device package and an external connection structure.

2. The semiconductor device package of claim 1, wherein:
    the first substrate includes an integrated circuit device, and
    the second substrate includes a micro-electrical-mechanical system (MEMS) device.

3. The semiconductor device package of claim 2, wherein the MEMS device of the second substrate is hermetically sealed by a third substrate and the first substrate; and wherein the third substrate is bonded to the first substrate.

4. The semiconductor device package of claim 1, wherein the through silicon via physically contacts the gate structure.

5. The semiconductor package of claim 1, wherein the gate structure is polysilicon gate structure.

6. The semiconductor package of claim 1, wherein the copper layer has a thickness in a range from about 5 μm to about 10 μm.

7. The semiconductor package of claim 1, wherein space in the through silicon via not filled by the copper layer is filled with a polymer layer.

8. The semiconductor package of claim 1, wherein the connection structure is selected from the group consisting of a solder bump and a copper post.

9. The semiconductor package of claim 1, wherein the connection structure physically contacts the redistribution layer.

10. The semiconductor package of claim 1, wherein the copper-barrier sub-layer contains a material selected from a group consisting of Ta, TaN, Ti, TiN, and CoW.

11. The semiconductor package of claim 1, wherein the depth of the through silicon via is in a range from about 100 μm to about 200 μm.

12. A semiconductor device package, comprising:
    a first substrate electrically bonded to a second substrate, wherein the first substrate having a through silicon via extending from a first surface of the first substrate to a polysilicon gate structure of the first; and
    an interconnect structure between the polysilicon gate structure and the second substrate,
    wherein the polysilicon gate structure is connected to the interconnect structure on an opposite side of the ploysilicon gate structure from the through silicon via, and
    wherein the through silicon via is lined with an isolation layer and a conductive layer with a copper-barrier sub-layer and a copper-seed sub-layer,
    wherein a copper layer is deposited on the conductive layer,
    wherein the through silicone via physically contacts the polysilicon gate structure,and
    the through silicon via is electrically coupled to a connection structure of the semiconductor device package that enables electrical contact between the semiconductor device package and an external connection structure.

13. The semiconductor device package of claim 12, wherein:
    the first substrate includes an integrated circuit device, and
    the second substrate includes a micro-electrical-mechanical system (MEMS) device.

14. The semiconductor device package of claim 13, wherein the MEMS device of the second substrate is hermetically sealed by a third substrate and the first substrate; and
    wherein the third substrate is bonded to the first substrate.

15. A manufacture comprising:
    a first substrate comprising:
        an electrical device;
        an interconnect structure at a first side of the first substrate and over the electrical device, the interconnect structure having a metal structure;
        a through-silicon via defined in the first substrate and extending from the interconnect structure to a lower surface of the first substrate, the lower surface being at a second side of the first substrate opposite the first side of the first substrate;
        a bump on the lower surface of the first substrate;
        a conductive structure in the through-silicon via and electrically connecting the metal structure of the interconnect structure and the bump; and
        a polysilicon gate structure between the interconnect structure and the through-silicon via and in contact with the conductive structure;
    a second substrate over the interconnect structure of the first substrate, the second substrate comprising:
        a micro-electrical-mechanical system (MEMS) device; and
        an opening defined in the second substrate; and a third substrate over the second substrate, the third substrate having a protrusion portion through the opening of the second substrate and in contact with the first substrate, the first substrate and the third substrate being configured to hermetically seal the MEMS device of the second substrate.

16. The manufacture of claim 15, wherein the first substrate further comprises:

an isolation layer on a side wall of the through-silicon via and between the side wall and the conductive structure.

17. The manufacture of claim 16, wherein the conductive structure is a conductive film lined on the isolation layer.

18. The manufacture of claim 17, wherein the conductive film define a remaining space in the through-silicon via, and the remaining space is filled with a polymer layer.

19. The manufacture of claim 15, wherein the conductive structure is in contact with the metal structure of the interconnect structure.

20. The manufacture of claim 15, wherein the first substrate further comprises:

at least one contact plug connecting thepolysilicon gate structure and the metal structure of the interconnect structure.

* * * * *

UNITED STATES PATENT AND TRADEMARK OFFICE
CERTIFICATE OF CORRECTION

| | | |
|---|---|---|
| PATENT NO. | : 8,836,116 B2 | Page 1 of 2 |
| APPLICATION NO. | : 12/944118 | |
| DATED | : September 16, 2014 | |
| INVENTOR(S) | : Hsueh-An Yang | |

It is certified that error appears in the above-identified patent and that said Letters Patent is hereby corrected as shown below:

In the Claims

Column 11, claim 1, line 31; please remove the word "wherein"

Column 11, claim 1, line 43; please replace "connnected" with --connected--

Column 11, claim 5, line 60; please replace "semiconductor package" with --semiconductor device package--

Column 11, claim 5, line 61; please replace "is polysilicon gate" with --is a polysilicon gate--

Column 11, claim 6, line 62; please replace "semiconductor package" with --semiconductor device package--

Column 11, claim 7, line 65; please replace "semiconductor package" with --semiconductor device package--

Column 12, claim 8, line 1; please replace "semiconductor package" with --semiconductor device package--

Column 12, claim 9, line 4; please replace "semiconductor package" with --semiconductor device package--

Column 12, claim 10, line 7; please replace "semiconductor package" with --semiconductor device package--

Column 12, claim 11, line 10; please replace "semiconductor package" with --semiconductor device package--

Signed and Sealed this
First Day of March, 2016

Michelle K. Lee
*Director of the United States Patent and Trademark Office*

CERTIFICATE OF CORRECTION (continued)
U.S. Pat. No. 8,836,116 B2

Column 12, claim 12, line 15; please remove the word "wherein"

Column 12, claim 12, line 17; please replace "of the first" with --of the first substrate--

Column 12, claim 12, lines 21-22; please replace "plolysilicon" with --polysilicon--

Column 12, claim 12, line 28; please replace "silicone" with --silicon--

Column 12, claim 12, line 29; please replace "structure,and" with --structure, and--

Column 13, claim 18, line 15; please replace "define" with --defines--

Column 13, claim 20, line 15; please replace "thepolysilicon" with --the polysilicon--